United States Patent [19]

Baliga et al.

[11] Patent Number: 4,620,211
[45] Date of Patent: Oct. 28, 1986

[54] METHOD OF REDUCING THE CURRENT GAIN OF AN INHERENT BIPOLAR TRANSISTOR IN AN INSULATED-GATE SEMICONDUCTOR DEVICE AND RESULTING DEVICES

[75] Inventors: Bantval J. Baliga; Victor A. K. Temple, both of Clifton Park; Tat-Sing P. Chow, Schenectady, all of N.Y.

[73] Assignee: General Electric Company, Schenectady, N.Y.

[21] Appl. No.: 640,280

[22] Filed: Aug. 13, 1984

[51] Int. Cl.[4] .................. H01L 29/74; H01L 29/78; H01L 29/167
[52] U.S. Cl. .................. 357/38; 357/23.4; 357/91; 357/64
[58] Field of Search .............. 357/38, 38 S, 91, 64, 357/29, 23.4, 37

[56] References Cited

U.S. PATENT DOCUMENTS

| | | | |
|---|---|---|---|
| 3,625,781 | 12/1971 | Joshi et al. | 357/64 |
| 4,056,408 | 11/1977 | Bartko et al. | 357/91 |
| 4,291,329 | 9/1981 | Hanes et al. | 357/38 |
| 4,364,073 | 12/1982 | Becke et al. | 357/23 |
| 4,417,385 | 11/1983 | Temple | 357/23.4 |

OTHER PUBLICATIONS

Kahng, D., *Silicon Integrated Circuits,*-Part B, Academic Press, ©1981, pp. 141-145.
B. J. Baliga et al., "The Insulated-Gate Rectifier (IGR): A New Power Switching Device", IEDM #82 (Dec. 1982), pp. 264-267.
K. S. Tarneja et al., "Electron Irradiation—A Method of Producing Fast Switching High Power Diodes", PESC 75 Record, pp. 269-272.
K. H. Zaininger, "Irradiation of MIS Capacitors with High Energy Electrons", IEEE Transactions on Nuclear Science, vol. NS-13, No. 6 (Dec. 1966), pp. 237-247.
V. I. Gubskaya et al., "Radiation Defects in N-Type Silicon Irradiated with Alpha Particles", Soc. Phys. Semicond., vol. 13 (Jan. 1979), pp. 97-99.
Y. Zohta et al., "Shallow Donor State Produced by Proton Bombardment of Silicon", Japan, J. Appl. Phys., vol. 10 (1971), pp. 532-533.
Y. Ohmura et al., "Electrical Properties of N-Type Si Layers Doped with Proton Bombardment Induced Shallow Donors", Solid State Communications, vol. 11 (1972), pp. 263-266.
K. L. Wang, "A System for Measuring Deep-Level Saptial Concentration Distributions", Solid State Communications, vol. 53 (Jan. 1982), pp. 449-453.
Y. Wada et al., "Lifetime Evaluation of Ion Implanted Layers by Pulsed MOS Capacitance", Japan, J. Appl. Phys., vol. 14 (1975), pp. 1405-1406.
T. P. Chow et al., "The Effect of Hydrogen and Helium Implantation on Silicon MOS Characteristics", Electrochemical Society Spring Meeting, Extended Abstracts YM84-1 (1984), Abstract #15, p. 172.
J. P. Russell et al., "The COMFET-A New High Conductance MOS-Gated Device", IEEE Electron Device Letters, vol. EDL-4 (Mar. 1983), pp. 63-65.
S. M. Sze, *Physics of Semiconductor Devices,* New York: John Wiley & Sons, (1969), pp. 320-326.

*Primary Examiner*—Andrew J. James
*Assistant Examiner*—R. P. Limanek
*Attorney, Agent, or Firm*—John R. Rafter; James C. Davis, Jr.; Marvin Snyder

[57] ABSTRACT

Reduction in the forward current gain of an inherent bipolar transistor in an insulated-gate semiconductor device such as an IGT or an IGFET is achieved by implantation of selected ions into the semiconductor material of such device. The ions, which create defects in the implanted region constituting current carrier recombination centers, form a layer with a peak concentration situated in proximity to the emitter-base junction of the inherent bipolar transistor. The layer of ions is of small thickness, whereby the resulting increase in the respective sheet resistances of the emitter and base layers to either side of the emitter-base junction is minimized.

7 Claims, 5 Drawing Figures

METHOD OF REDUCING THE CURRENT GAIN OF AN INHERENT BIPOLAR TRANSISTOR IN AN INSULATED-GATE SEMICONDUCTOR DEVICE AND RESULTING DEVICES

BACKGROUND AND SUMMARY OF THE INVENTION

The present invention relates to a method of lowering the forward current gain of an inherent bipolar transistor in a semiconductor device such as an insulated-gate transistor or an insulated-gate field effect transistor, and further relates to semiconductor devices resulting from the present gain reduction method.

A typical insulated-gate transistor (IGT) constitutes a 4-layer semiconductor device (i.e., a P-N-P-N device). The 4-layer structure constitutes an inherent thyristor in the IGT and is susceptible to latching into an "on", or conducting, state in thyristor fashion, in which case control of IGT current by the gate thereof is lost and turn-off of the IGT requires reversal of the voltage impressed across the device, a technique known as commutation. It is known that a 4-layer device may be modelled as a pair of regeneratively coupled bipolar transistors. It is further known that thyristor action will be suppressed in the 4-layer device so long as the sum of the forward current gains of the two, inherent bipolar transistors is maintained below unity. The present invention is particularly directed towards reduction in the forward current gain of one of the inherent bipolar transistors in a 4-layer device, such as an IGT, with the ultimate goal of increasing the level of current that an IGT can conduct before latching on in thyristor fashion.

A typical insulated-gate field-effect transistor (IGFET), commonly referred to as power metal-oxide-semiconductor field-effect transistor (MOSFET), also includes an inherent bipolar transistor, turn-on of which is desirably suppressed for IGFET operation at high current levels. This can be achieved by the method of the present invention, which is directed towards a reduction in the forward current gain of such an inherent bipolar transistor.

It, accordingly, is a principal object of the invention to provide a method for reducing the forward current gain of an inherent bipolar transistor in an insulated-gate semiconductor device and also to provide the resulting devices.

It is a further object of the invention to provide a method of reducing the forward current gain of an inherent bipolar transistor in an insulated-gate semiconductor device wherein the method may be carried out through the use of conventional semiconductor fabrication equipment.

A more particular object of the invention is to provide an insulated-gate transistor with increased current-conduction capability without thyristor latchon.

In an embodiment of the invention particularly concerning an IGT, the foregoing objects are attained in a method of reducing the forward current gain of an inherent bipolar transistor in such device. The IGT is of the type including, in a silicon semiconductor wafer, a drift layer, a base layer overlying the drift layer, and an emitter layer overlying the base layer and forming an emitter-base junction therewith, the drift, base, and emitter layers constituting an inherent bipolar transistor. The IGT further includes a base electrode insulatingly spaced from the base layer.

The present method comprises the steps of providing a source of ions having the capacity to create current carrier recombination centers in silicon semiconductor material upon implantation therein. These ions are implanted into the upper portion of the silicon semiconductor wafer at an energy level selected to yield a layer of ions with a peak concentration situated at the emitter-base junction, within a tolerance of about plus or minus 20 percent of the thickness of the emitter layer. The implant dosage of the ions is preferably selected to be within a range having a lower limit (1) that is sufficiently high so as to reduce by at least about 1 order of magnitude the forward current gain of the inherent transistor and having an upper limit (2) that is sufficiently low as to raise by no more than about 20 percent the respective sheet resistivities of whichever of the emitter and base layers wherein the ion layer is situated.

In accordance with the invention, IGTs produced by the foregoing method are also provided.

BRIEF DESCRIPTION OF THE DRAWINGS

The features of the invention deemed to be novel are defined in the appended claims. The invention itself, however, both as to organization and operation, together with further objects and advantages thereof, may be best understood with reference to the following description when considered in conjunction with the accompanying drawings, in which:

DESCRIPTION OF THE PREFERRED EMBODIMENTS

Figure 1:
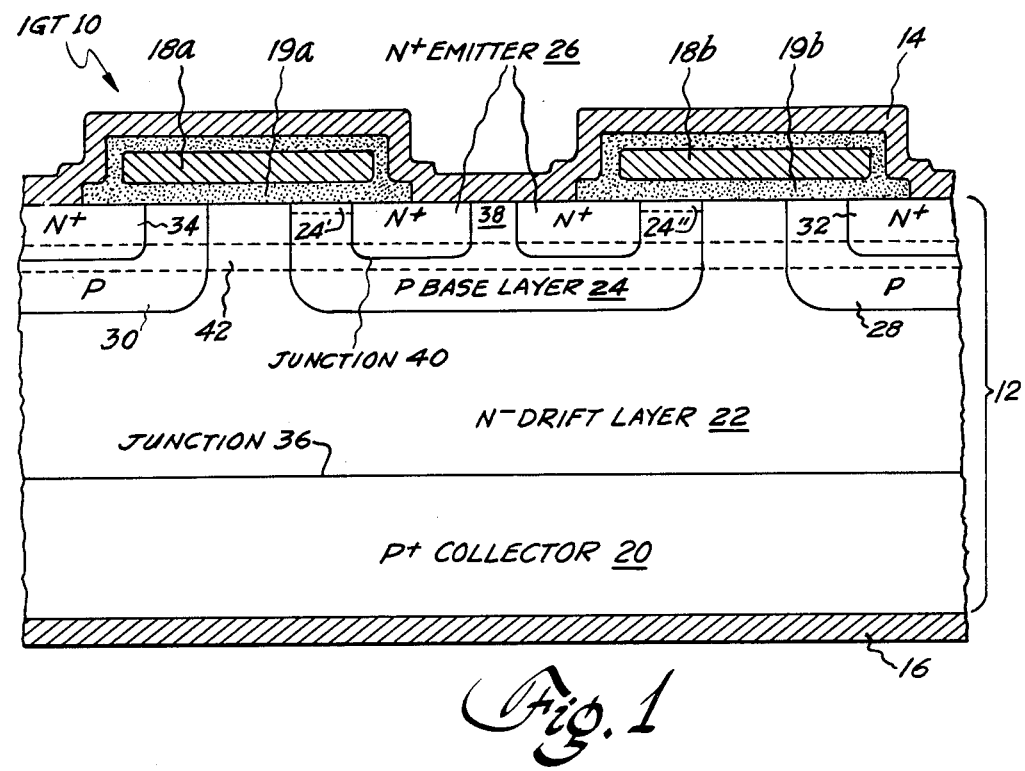
FIG. 1 is a schematic, cross-sectional view of an insulated-gate transistor in accordance with the present invention.

FIG. 1 illustrates an exemplary insulated-gate transistor (IGT) 10 incorporating the principles of the present invention. IGT 10 includes a semiconductor wafer 12 and emitter and collector electrodes 14 and 16, respectively, adjoining wafer 12. Base electrode portions 18a and 18b, which preferably comprise highly-doped polysilicon and which are interconnected with each other at some location in IGT 10 (not shown), are insulatingly spaced from wafer 12 by insulation layers 19a and 19b, respectively. Wafer 12 includes a P+ (or highly-doped, P-conductivity type) collector layer 20, which is contacted by collector electrode 16, and an N− (or lightly-doped, N-conductivity type) drift (or voltage-supporting) layer 12 overlying P+ collector layer 20. A P (or moderately-doped, P-conductivity type) base layer 24 overlies N− drift layer 22, and, in turn, is overlain by N+ emitter layer 26. Emitter layer 26 is contacted by emitter electrode 14 and is typically configured as a continuous loop when viewed from above with respect to the FIG. 1 orientation.

As will be apparent to those skilled in the art, base electrode 18a interacts with a portion 24' of P base layer 24 to create an inversion layer in portion 24' when base electrode 18a is biased with a positive voltage above a threshold value. When such inversion layer is present in P base layer portion 24', electrons from N+ emitter layer 26 can flow via such inversion layer into N− drift layer 22. Base electrode 18b similarly interacts with portion 24" of P base layer 24 to induce, upon suitable biasing of electrode 18b, an inversion layer electrically interconnecting N+ emitter layer 26 and N− drift layer 22. Spaced to the right and left of P base layer 24, as illustrated in FIG. 1, are further, structurally similar P base layers 28 and 30, respectively, and associated N+ emitter regions 32 and 34, respectively, these further base and emitter device regions functioning in the same manner as base and emitter layer 24 and 26, respectively, described immediately above.

Forward conduction in IGT 10 is initiated through formation of inversion layers in portions 24'and 24" of P base layer 24 through appropriate biasing of base electrodes 18a and 18b (discussed above), these inversion layers interconnecting N+ emitter layer 26 and N− drift layer 22. Then, with collector electrode 16 at a more positive potential than emitter electrode 14, electrons from the emitter electrode flow through N+ emitter layer 26 and into N− drift layer 22 via the inversion channels in P base layer portions 24' and 24". Concurrently, with P-N junction 36 (between P+ collector layer 20 and N− drift layer 22) biased above its inherent potential, P+ collector layer 20 injects hole current carriers into N− drift layer 22, the majority of such holes recombining with electrons in layer 22 that originate from emitter layer 26, a minority of such holes, however, flowing through P base layer 24, to the portion of emitter electrode 14 in the vicinity of portion 38 of P base layer 24. It is this latter, minority flow of holes through P base layer 24 with which the present invention is particularly concerned. This is because the hole current in P base layer 24 produces a voltage drop along emitter-base junction 40 due to the resistance of P base layer 24. If this voltage drop exceeds the inherent potential of emitter-base junction 40, N+ emitter layer 26 commences hole injection into N− drift layer 22, across P base layer 24. In this situation, IGT 10 becomes latched on in thyristor fashion and control of current in the device through biasing of base electrode portions 18a and 18b is lost. To turn off such a latched IGT 10 requires that it be commutated off, for example, in the same manner as a conducting thyristor.

Figure 2:
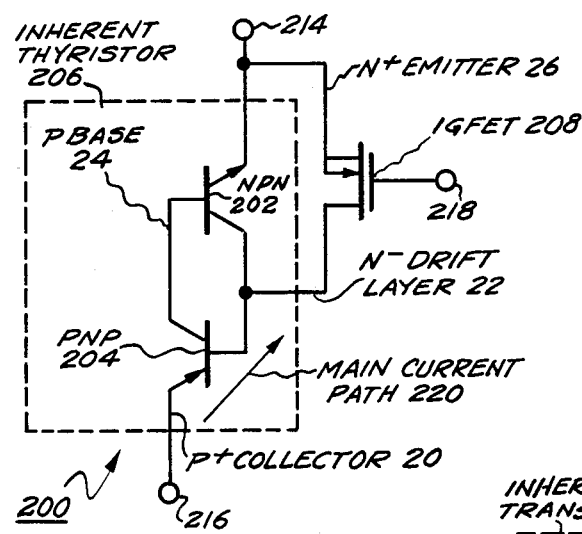
FIG. 2 is a schematic, electrical circuit representation of the IGT of FIG. 1.

A more complete understanding of the thyristor latch-on phenomenon of IGT 10 can be had through consideration of the FIG. 2 electrical circuit representation 200 of the IGT of FIG. 1. NPN bipolar transistor 202 of electrical circuit 200 is formed from the following, successive layers of IGT 10: N+ emitter layer 26, P base layer 24, and N− drift layer 22, while PNP bipolar transistor 204 is formed from the following, successive layers of IGT 10: P base layer 24, N− drift layer 22, and P+ collector layer 20. NPN and PNP transistors 202 and 204, respectively, are regeneratively coupled together so as to form an inherent thyristor 206. Electrical circuit 200 further includes an insulated-gate field-effect transistor (IGFET) 208 corresponding to the field-effect structure in IGT 10 (FIG. 1) formed by the combination of base electrodes 18a and 18b, insulating layers 19a and 19b, and P base layer portions 24' and 24" in which inversion layers are formed upon suitable biasing of the base electrodes. Electrical circuit 200 additionally includes emitter, collector, and base electrodes 214, 216, and 218, respectively, corresponding to emitter, collector, and base electrodes 14, 16 and 18, respectively, of IGT 10.

The main current path for hole current carriers in electrical circuit 200 from circuit collector electrode 216 to circuit emitter electrode 214 follows the direction of arrow 220, such path including the emitter-base portion of PNP transistor 204 and IGFET 208, but not NPN transistor 202. In accordance with a well-established principle of thyristor operation, inherent thyristor 206 will not latch on as long as the sum of the forward current gains $\alpha_{NPN}$ and $\alpha_{PNP}$ of NPN and PNP transistors 202 and 204, respectively, does not exceed unity. This condition is satisfied for a typical IGT only for device current conduction below a threshold, latching current level, since $\alpha_{NPN}$ and $\alpha_{PNP}$ are current dependent and increase with higher current levels, whereby the sum reaches unity at the threshold, latching current level.

A reduction in one or both of $\alpha_{NPN}$ and $\alpha_{PNP}$ achieves an increase in latching threshold current, and, if the reduction is sufficient in extent, immunity from thyristor latch-on can be attained. In accordance with the present invention, the forward current gain $\alpha_{NPN}$ of the "upper" transistor in IGT 10 (FIG. 1), corresponding to NPN bipolar transistor 202, is reduced.

Considering FIG. 1 again, reduction in the forward current gain of the upper, or NPN, transistor of IGT 10 is achieved (1) through a lowering of the emitter efficiency of the upper transistor by creating a layer 42 of current carrier recombination centers at least partially in N+ emitter layer 26 or (2) through a lowering of the base transport factor of the upper transistor by positioning recombination center layer 42 at least partially in P base layer 24 (or by a combination of the foregoing, two factors). The emitter efficiency and base transport factor are related to the forward current gain of the upper transistor by each being proportional to such current gain.

In accordance with the present invention, the desired recombination centers are formed by damage induced in semiconductor wafer 12 by electrostatically propelled ions. Such ion propulsion may advantageously be accomplished with conventional ion implantation equipment. Suitable ions comprise high mass neutral particles or atomic nuclei that have a controllable, shallow penetration depth (e.g., 1-3 microns) in silicon semiconductor material but (1) which are effective to produce defects in the implanted region that constitute current carrier recombination centers and (2) which are stable during any subsequent high temperature processing. Defects produced by implantation of argon atoms are known to be thermally stable at the high diffusion temperatures used to form P base layer 24 and N+ emitter layer 26, whereby ion implantation of argon may precede the formation of these layers. Other ions such as protons (i.e., hydrogen nuclei) create defects that are not thermally stable at the diffusion temperatures used in forming layers 24 and 26, and, thus, are implanted subsequent to the formation of these layers. Many types of ions may be implanted through polysilicon base electrodes 18a and 18b and insulating layers 19a and 19b (typically of silicon dioxide).

A suitable range of ion implant dosages is one with a lower limit (1) sufficiently high to significantly reduce the gain of the upper transistor (e.g., by at least about 1 order magnitude) by reducing the injection efficiency or base transport factor (or both) of the upper transistor and with an upper limit (2) sufficiently low to minimize the effects of ion implant damage in raising the respective sheet resistivities of P base layer 24 and N+ layer 26 (e.g., the increase in value of these sheet resistivities being limited to about 20 percent).

It is desired that the peak concentration of ions in layer 42 (and, hence, recombination centers) be situated proximate to emitter-base junction 40. This condition is graphically depicted in FIG. 3 in which an exemplary ion concentration profile 300 for protons (i.e., preferred ions) is plotted against thickness of a portion of wafer 12 (i.e., the vertical dimension of wafer 12 with respect to the FIG. 1 orientation thereof). The injection efficiency of the upper transistor in IGT 10 is significantly reduced without undue increase in the respective sheet resistivities of N+ emitter layer 26 if the peak concentration of ions in layer 40 is above emitter-base junction 40 within a tolerance of about 20 percent of the thickness of N+ emitter layer 26. Similarly, the base transport factor of the upper transistor is significantly reduced without undue increase in the sheet resistivity of P base layer 24 if the peak concentration is below emitter-base junction 40 within a tolerance of about 20 percent of the thickness of N+ emitter layer 26.

Figure 3:
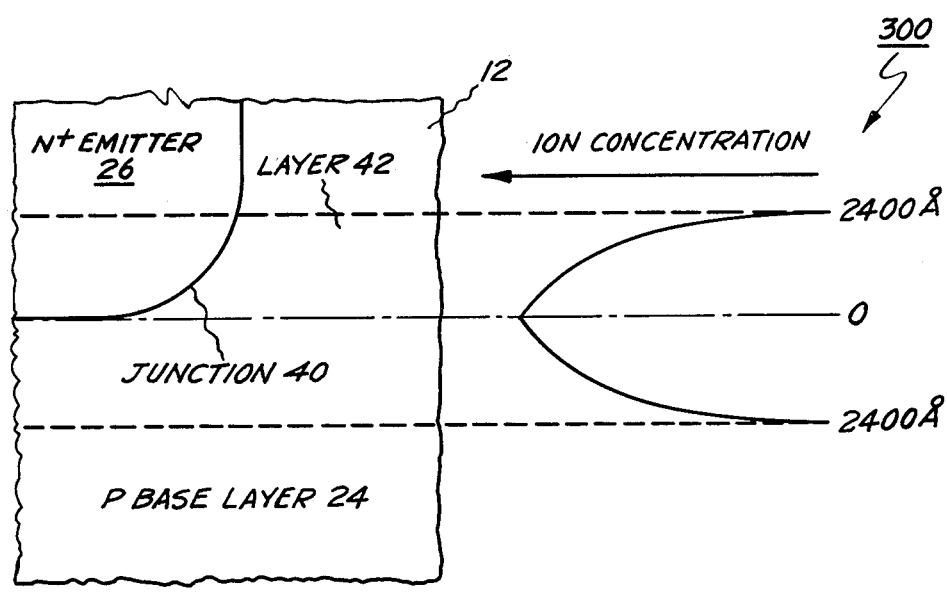
FIG. 3 is a graphical depiction of an ion concentration profile in accordance with the present invention together with an enlarged detail view of a portion of the IGT of FIG. 1.

In connection with minimizing the increase in the respective sheet resistivities of N+ emitter layer 26 and P base layer 24, it is particularly preferred that the thickness of recombination center layer 42 be as low as practicably possible. FIG. 3 additionally illustrates a typical thickness for a recombination center layer 42 that results from damage due to protons implanted at an energy of 160 KeV through 0.8 microns of silicon dioxide and 1 micron of silicon. Considering the upper and lower boundaries of layer 42 to coincide with two standard deviation lengths from the peak ion concentration situated at "0" in profile 300, the thickness of layer 42 is 4,800 angstroms or about 0.5 microns; in comparison, a typical thickness for N+ emitter layer 26 is about 1 micron.

When forming recombination center layer 42 with protons, a preferred implant dosage has been found to be from about $10^{14}$ to $10^{15}$ proton ions per square centimeter (the conventional units of measuring implant dosage). This range has been found to be sufficiently high to significantly reduce the gain of the upper transistor (e.g., by at least about 1 order of magnitude) while being low enough so as to not raise the respective sheet resistances of base and emitter layers 24 and 26, respectively, by more than about 20 percent.

A characteristic of implanted proton ions is that they have a tendency to convert high resistivity N-conductivity type material to more conductive N-conductivity type material. This can result in the electrical shorting together of device portions normally separated from each other by high resistivity, N-conductivity type material. Accordingly, selective masking of IGT 10 prior to implantation with protons may be desirable, such as, for example, over electrical field termination rings (not shown) at the periphery of IGT 10 that are typically separated from each other by high resistivity, N-conductivity type semiconductor material.

Various types of implant ions may be used to create recombination center layer 42, with different costs and benefits for each type of ion. Protons ions, mentioned above, are preferred due to the controllability of their implant depth and also because proton-induced damaged, if desired, may be conveniently eradicated from IGT 10 through annealing at about 700° Centigrade for about 20 minutes. Helium ions, which are heavier than proton ions, can be used but require a somewhat higher implant energy than for proton ions and result in a somewhat thicker recombination center 42 for the same penetration depth. Other ions that may be used for forming recombination center layer 42 are deuterium and tritium ions.

Figure 4:
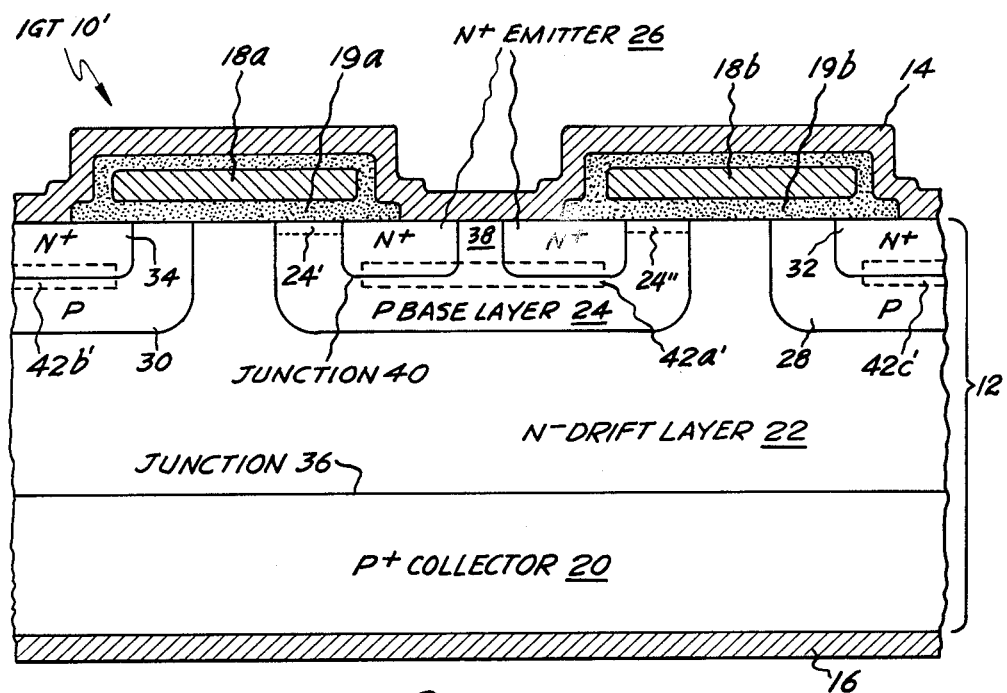
FIG. 4 is a view of an IGT similar to FIG. 1, illustrating an IGT in accordance with a further embodiment of the present invention.

In a further embodiment of the present invention as illustrated in FIG. 4, a modified recombination center layer comprises multiple layers 42a', 42b', and 42c', which are interrupted, or nonexistent, beneath base electrode portions 18a and 18b. Formation of the multiple recombination center layers 42a', 42b', and 42c' may be conveniently accomplished by adjusting the implant energy to be insufficient for ion penetration through base electrodes 18a and 18b but sufficient for ion penetration to emitter-base junction 40. Accordingly, insulating layers 19a and 19b beneath base electrodes 18a and 18b, respectively, do not incur implant damage in the formation of recombination center layers, which damage would raise the threshold voltages on base electrodes 18a and 18b for formation of inversion layers in P base layer portions 24' and 24".

Figure 5:
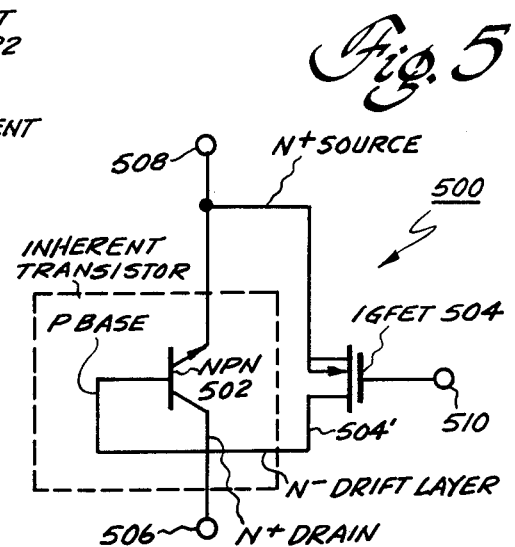
FIG. 5 is a schematic, electrical circuit representation of an insulated-gate field-effect transistor benefitting from the present invention.

The principles of the present invention are applicable to power MOSFETS (not illustrated) to prevent loss of current control by the gate electrode of the power MOSFET due to turn-on of an inherent bipolar transistor in the device. A typical power MOSFET is structurally similar to IGT 10 of FIG. 1, with the exception that an N+ drain region is used in the power MOSFET in lieu of the illustrated P+ collector region. Accordingly, a power MOSFET does not include two, inherent bipolar transistors as does an IGT, but only one inherent bipolar transistor, and, as such, may be schematically depicted by electrical circuit 500 of FIG. 5. Circuit 500 includes an inherent, NPN transistor 502 and an IGFET 504, the lower terminal 504' of IGFET 504 being electrically connected to an N+ drain layer and, thence, to a drain electrode 506. Reduction in the forward current gain of NPN transistor in a power MOSFET, corresponding to NPN transistor 502 of circuit 500, by the creation in the MOSFET of a recombination center layer as described above desirably inhibits the turn-on of such transistor and thus avoids the loss of current control by the gate electrode of the power MOSFET.

In the electrical circuit representation 500 of a power MOSFET, device electrodes 508 and 510 are customarily termed "source" and "gate" electrodes, respectively. For the purposes of the present invention, however, the IGT-derived terms "emitter" and "base" are interchangeably used to designate "source" and "gate" electrodes, respectively. This "emitter"-"source" and "base"-"gate" interchangeability as regards device electrodes similarly applies to regions of semiconductor material of power MOSFETS or IGTs.

The foregoing describes insulated-gate semiconductor devices in which the forward current gains of inherent bipolar transistors of such devices are beneficially reduced. The method of the present invention for reducing such forward current gains may be carried out with conventional ion implantation equipment and, thus, can be readily incorporated into a semiconductor fabrication sequence.

While only certain preferred features of the invention have been shown by way of illustration, many modifications and changes will occur to those skilled in the art.

It is, therefore, to be understood that the appended claims are intended to cover all such modifications and changes as fall within the true spirit and scope of the invention.

What is claimed as the invention and desired to be secured by Letters Patent of the United States is:

1. An insulated-gate power semiconductor device comprising:
   (a) a semiconductor drift layer of one conductivity type;
   (b) a collector layer of opposite type conductivity adjacent said drift layer;
   (c) a semiconductor base region of opposite conductivity type situated in said drift layer and forming a base drift junction therewith;
   (d) a semiconductor emitter region of said one conductivity type situated in said base region and forming an emitter-base junction therewith, said semiconductor emitter region, said semiconductor base region and said semiconductor drift layer including portions forming a first surface of said device;
   (e) an insulated-gate electrode contiguous with said base region, said insulated-gate electrode, only when appropriately biased, including a channel in said base region beneath said insulated-gate electrode, said channel conductively coupling one type conductivity carriers from said emitter region to said drift region during gate induced forward conduction in said semiconductor device and said insulated-gate electrode, when unbiased or reverse biased, repressing said channel to decouple said drift and emitter regions to render said device nonconductive and inhibit the flow of said one type conductivity carriers from said emitter region to said drift region; and
   (f) a layer of recombination centers contained within a region of semiconductor material comprising a portion of said emitter and base regions, said recombination centers being effective to inhibit the injection of one conductivity type carriers from said emitter region into the base region and the transport of one type carrier through the base region so as to reduce current gain at high current levels and said layer of recombination centers exhibiting a peak concentration situated beneath said first surface of said device at said emitter-base junction to within a tolerance of about 20 percent of the thickness of said emitter region, said layer of recombination centers being spaced from said base drift junction.

2. The insulated-gate semiconductor device of claim 1 wherein said recombination centers comprise protons with a dosage in a range from about $10^{14}$ to $10^{15}$ ions per square centimeter.

3. The insulated-gate semiconductor device of claim 1 wherein said layer of recombination centers is interrupted beneath said base electrode.

4. The insulated-gate semiconductor device of claim 1 wherein said semiconductor drift, base, and emitter layers each comprise silicon semiconductor material.

5. The semiconductor device of claim 1 wherein said base region comprises N-type material and the effective energy level of said recombination centers in said N-type material lies below a midgap energy level between the conduction and valence bands.

6. The semiconductor device of claim 1 wherein said base region comprises P-type material and the effective energy level of said recombination centers in said P-type material lies above a midgap energy level between the conduction and valence bands.

7. An insulated-gate power semiconductor device exhibiting lower forward current gain at high current levels comprising:
   (a) a semiconductor drift layer of one conductivity type adjacent a collector layer of opposite type conductivity;
   (b) a semiconductor base region of opposite conductivity type situated in said drift layer and forming a base drift junction therewith;
   (c) a semiconductor emitter region of the same conductivity type as said drift layer situated in said base region and forming an emitter-base junction therewith, said semiconductor emitter region, said semiconductor base region and said semiconductor drift layer including portions forming a first surface of said device;
   (d) an insulated-gate electrode, contiguous with said base region said insulated-gate electrode, only when appropriately biased inducing a channel in said base region benath said insulated-gate electrode, said channel conductively coupling one type conductivity carriers from said emitter region to said drift region during gate induced forward conduction in said semiconductor device and said insulated-gate electrode, when unbiased or reverse biased, repressing said channel to decouple said drift and emitter regions to render said devices nonconductive and inhibit the flow of one type conductivity carriers from said emitter region to said drift region; and
   (e) adjacent portions of said semiconductor base region and semiconductor emitter region having recombination centers disposed therein in sufficient concentration to reduce the forward gain by an order of magnitude at high current levels and raise by no more than 20% the sheet resistivities of said emitter and base layers said recombination centers forming a recombination region, said recombination region being spaced beneath said first surface of said device and having a peak concentration at said base emitter junction and said recombination region being spaced from said base drift junction.

* * * * *